United States Patent
Costa et al.

(10) Patent No.: US 11,119,695 B2
(45) Date of Patent: Sep. 14, 2021

(54) MEMORY DISPATCHER

(71) Applicant: Infineon Technologies AG, Neubiberg (DE)

(72) Inventors: Pedro Costa, Munich (DE); Muhammad Hassan, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/367,694

(22) Filed: Mar. 28, 2019

(65) Prior Publication Data

US 2020/0310683 A1 Oct. 1, 2020

(51) Int. Cl.
| | |
|---|---|
| G06F 3/06 | (2006.01) |
| G06F 11/10 | (2006.01) |
| G06F 9/50 | (2006.01) |
| G06F 11/14 | (2006.01) |
| G06F 11/16 | (2006.01) |
| G11C 29/00 | (2006.01) |
| G06F 11/08 | (2006.01) |
| G06F 16/2455 | (2019.01) |
| G06F 9/38 | (2018.01) |
| G06F 12/0811 | (2016.01) |

(52) U.S. Cl.
CPC .......... *G06F 3/0659* (2013.01); *G06F 3/0604* (2013.01); *G06F 3/065* (2013.01); *G06F 3/0673* (2013.01); *G06F 9/5016* (2013.01); *G06F 11/1004* (2013.01); *G06F 3/0641* (2013.01); *G06F 3/0689* (2013.01); *G06F 9/3885* (2013.01); *G06F 11/08* (2013.01); *G06F 11/1016* (2013.01); *G06F 11/1453* (2013.01); *G06F 11/167* (2013.01); *G06F 11/1641* (2013.01); *G06F 11/1658* (2013.01); *G06F 11/1666* (2013.01); *G06F 12/0811* (2013.01); *G06F 16/24556* (2019.01); *G11C 29/74* (2013.01)

(58) Field of Classification Search
CPC ............ G06F 11/1641; G06F 11/1658; G06F 9/3885; G06F 11/08; G06F 11/1666; G06F 3/0689; G06F 12/0811; G06F 16/24556; G06F 3/0641; G06F 11/167; G06F 11/1016; G06F 11/1453; G06F 3/065; G06F 3/0659; G11C 29/74
See application file for complete search history.

(56) References Cited

U.S. PATENT DOCUMENTS

| | | | | |
|---|---|---|---|---|
| 5,251,227 | A * | 10/1993 | Bruckert | ............ G06F 1/24 714/23 |
| 2004/0083421 | A1 * | 4/2004 | Foss | ............ G06F 11/1064 714/805 |

(Continued)

*Primary Examiner* — April Y Blair
*Assistant Examiner* — Sazzad Hossain
(74) *Attorney, Agent, or Firm* — Schiff Hardin LLP

(57) ABSTRACT

A memory dispatcher, including an address decoder configured to decode a write address of received write data; a lockstep processor configured to generate, based on the decoded write address, primary and redundant memory write addresses and corresponding primary and redundant copies of the write data, if the decoded write address corresponds with a lockstep region of the memory; and a comparator coupled to the lockstep processor, and configured to compare the primary and redundant copies of the write data, and to compare the primary and redundant memory write addresses.

23 Claims, 6 Drawing Sheets

(56) References Cited

U.S. PATENT DOCUMENTS

| | | | |
|---|---|---|---|
| 2006/0036901 A1* | 2/2006 | Yang | G06F 11/2074 714/6.12 |
| 2006/0149903 A1* | 7/2006 | Sugimoto | G06F 11/1658 711/127 |
| 2011/0082970 A1* | 4/2011 | Rohleder | G11C 29/74 711/104 |
| 2012/0304017 A1* | 11/2012 | Martin | G06F 11/1612 714/43 |
| 2015/0242124 A1* | 8/2015 | Law | G06F 3/0658 711/103 |
| 2015/0378856 A1* | 12/2015 | Yamakawa | G06F 3/0683 714/6.3 |
| 2016/0055047 A1* | 2/2016 | Okamoto | G06F 11/22 714/57 |
| 2017/0293443 A1* | 10/2017 | Harman | G06F 3/0659 |
| 2018/0039538 A1* | 2/2018 | Freikorn | G06F 11/1048 |
| 2019/0227863 A1* | 7/2019 | Oho | G06F 11/0751 |

\* cited by examiner

Figure 4

400
Method of Memory Dispatching

410
Decoding, by an address decoder, a write address of received write data or a read address;

420
Generating, by a lockstep processor, and based on the decoded write address or the decoded read address:

422
primary and redundant external memory write addresses and corresponding primary and redundant copies of the write data, if the decoded write address corresponds with a lockstep region of an external memory;

or

424
primary and redundant external memory read addresses, if the decoded read address corresponds with a lockstep region of the external memory;

430
Comparing, by a comparator coupled to the lockstep processor:

432
the primary and redundant copies of the write data, and the primary and redundant external memory write addresses;

or

434
the primary and redundant copies of the read data, and the primary and redundant external memory read addresses.

MEMORY DISPATCHER

BACKGROUND

Autonomous driving is classified by the Society of Automotive Engineering (SAE) International's standard J3016 into six levels: 0 (no automation) to 5 (full automation). Autonomous driving at level 2+ requires high computation algorithms. Increased computation corresponds with increased data exchange between computation units and volatile memory.

Volatile memory in a System on Chip (SoC)-based approach has a price versus storage tradeoff that is addressed by using both internal chip memory and external Dynamic Random Access Memory (DRAM). External memory, which is mostly provided by the consumer market, does not meet the automotive industry's safety requirements.

Automotive Safety Integrity Level (ASIL) is a risk classification scheme defined by the International Organization for Standardization (ISO) 26262 into four levels: ASIL-A, ASIL-B, ASIL-C, and ASIL-D. ISO26262 also classify hazards as Quality Management (QM) if the risk associated with it is negligible. ASIL-D dictates the highest integrity requirements, and QM dictates no safety requirements at all. In particular, ASIL-D represents likely potential for severely life-threatening or fatal injury in the event of a malfunction, and requires the highest level of assurance that the dependent safety goals are sufficient and have been achieved. Microcontroller computations and communications with internal memory at the ASIL-D integrity level include features such as lockstep, Error Detection Correction (EDC), Memory Built-In Self-Test (MBIST), and watchdog. External memory, on the other hand, only meets up to ASIL-B integrity level. There is thus a need while using ASIL-B external memory to still meet ASIL-D integrity levels.

BRIEF DESCRIPTION OF THE DRAWINGS

FIG. 4 illustrates a flowchart of a method of memory dispatching in accordance with aspects of the disclosure.

DETAILED DESCRIPTION

The present disclosure is directed to a memory dispatcher for accessing a memory. The memory dispatcher has two modes—lockstep mode and full performance (non-lockstep) mode. The mode is set based on a required integrity level of a memory region to which a memory access address corresponds. The lockstep mode is for data requiring a high integrity level (e.g., ASIL-D) and provides double data storage without a processing unit accessing a memory twice. The full performance (non-lockstep) mode is for data requiring a lower integrity level (e.g., ASIL-B) and does not replicate data.

Figure 1A:
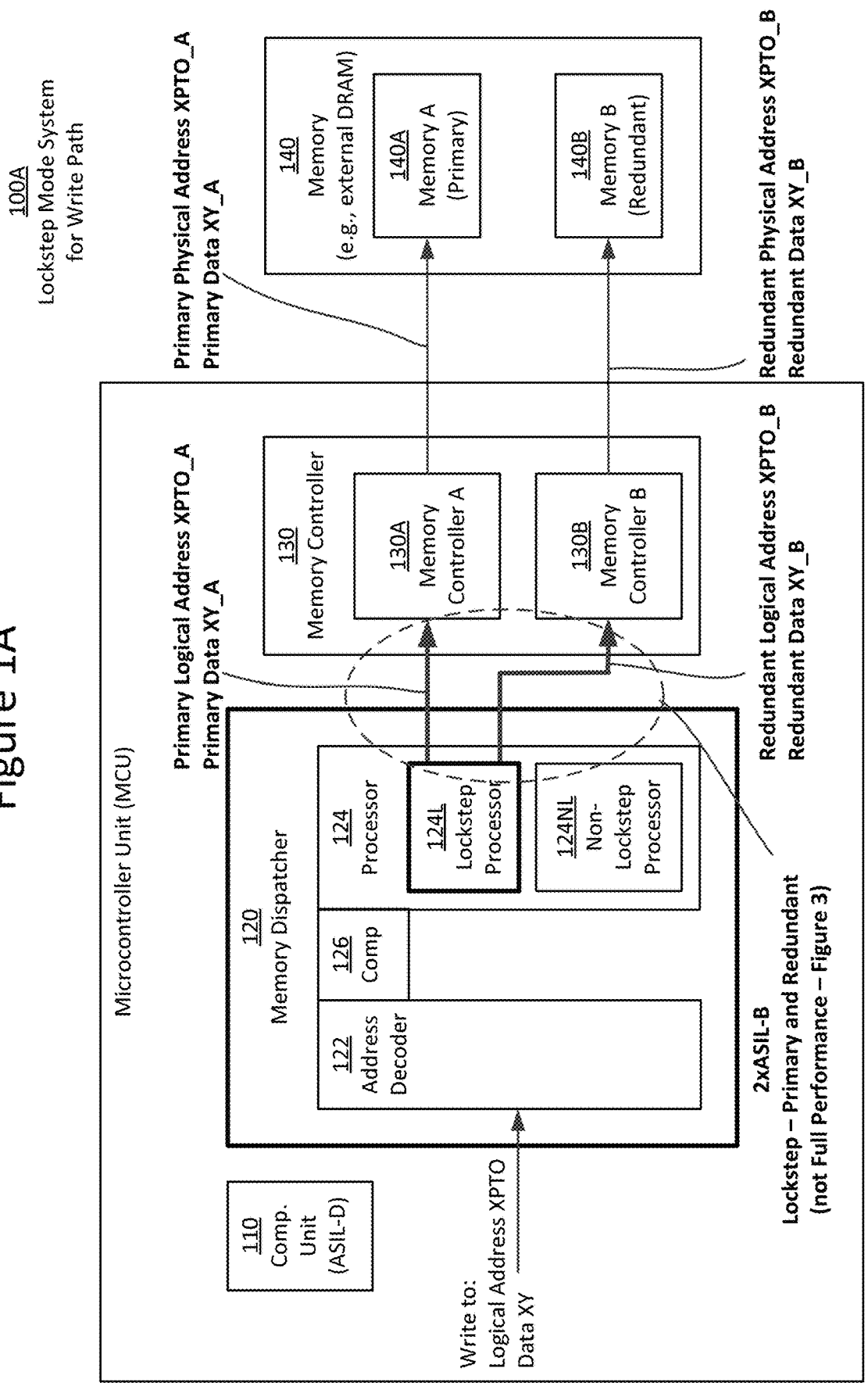
FIG. 1A illustrates a schematic diagram of a lockstep mode system for a write path in accordance with aspects of the disclosure.
Figure 1B:
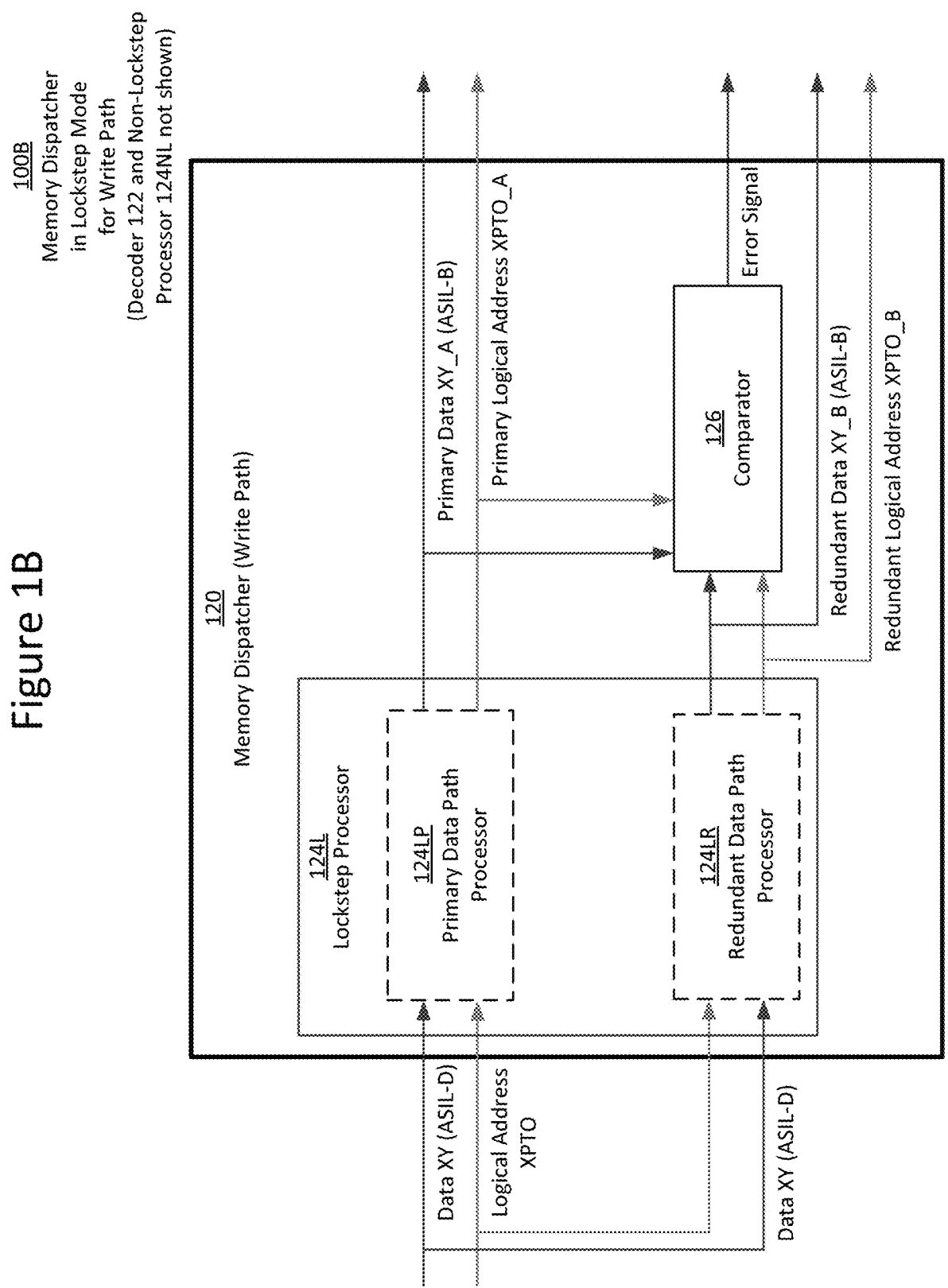
FIG. 1B illustrates a schematic diagram of a memory dispatcher of the lockstep mode system for a write path of FIG. 1A in accordance with aspects of the disclosure.

FIG. 1A illustrates a schematic diagram of a lockstep mode system 100A for a write path in accordance with aspects of the disclosure. FIG. 1B illustrates a schematic diagram of a memory dispatcher 120 of FIG. 1A.

By way of overview, the lockstep mode system 100A has a memory dispatcher 120 for writing data to a memory 140 in lockstep mode. The lockstep mode is for data requiring a high integrity level (e.g., ASIL-D). The memory dispatcher 120 duplicates the data and corresponding write address to write the original and duplicate data in two respective memories 140A, 140B without processing unit intervention.

The lockstep mode system 100A comprises a MCU coupled to an external memory 140.

The MCU comprises a computation unit 110, a memory dispatcher 120, and a memory controller 130.

The computation unit 110 may comprise, for example, a Radar Processing Unit, application cores, etc. The disclosure is not limited in this respect; the computation unit 110 may comprising and computing units as suitable. The computation unit 110 is configured to perform the MCU computations at ASIL-D.

The memory controller 130 comprises a memory controller 130A and a memory controller 130B. The memory controller 130 may be, for example, a Dynamic Random Access Memory (DRAM) controller or a Direct Memory Access (DMA) controller. Each of the memory controllers 130A, 130B is configured to generate, from a logical address, a physical address of the memory 140 and initiate a memory write cycle.

The memory 140 comprises a memory 140A and a memory 140B. Each of the memory 140A and memory 140B may be referred to as a channel. The memory 140A is written using memory controller 130A, and the memory 140B is written using memory controller 130B. The memory 140A and the memory 140B may be physically separate memories, or alternatively, separate areas of a same physical memory. The memory 140 may by an external DRAM memory, though the disclosure is not limited in these respects. The memory 140 may be external or internal, and/or may be any memory type (e.g., flash) as suitable.

The memory dispatcher 120 comprises an address decoder 122, a processor 124, and a comparator 126.

The address decoder 122 receives a single logical write address XPTO and write data XY. The received write data XY has an integrity level ASIL-D. The address decoder 122 is configured to decode the logical write address XPTO.

The processor 124 comprises a lockstep processor 124L and a non-lockstep processor 124NL. If the decoded write address corresponds with a lockstep region of the memory 140, the lockstep processor 124L performs the processing and provides a higher integrity level, such as ASIL-D, by generating primary and redundant copies of the data XY and addresses XPTO in lockstep.

More specifically, if the decoded write address corresponds with a lockstep region of the memory 140, the lockstep processor 124L is configured to generate, based on the decoded write address, primary and redundant memory write addresses XPTO_A, XPTO_B and corresponding primary and redundant copies of the write data XY_A, XY_B in lockstep. Each of the primary and redundant copies of the write data XY_A, XY_B have an integrity level ASIL-B, but together in lockstep they have an integrity level ASIL-D. The redundant write data XY_B may be generated according to ISO 26262 titled "Road vehicles—Functional safety."

As shown in FIG. 1B, the lockstep processor 124L comprises a primary data path processor 124LP and a redundant data path processor 124LR. The address XPTO and data XY arrive from one path to both the primary data path processor 124LP and the redundant data path processor 114LR, which operate in lockstep. The primary data path processor 124LP generates the primary memory write address XPTO_A and the primary copy of the write data XY_A. The redundant data path processor 114LR generates the redundant memory write address XPTO_B and the redundant copy of the write data XY_B in lockstep with the primary data path processor 114LP. The primary data path processor 124LP and the redundant data path processor 124LR may be separate processors, or alternatively, different functions within the same physical processor.

The lockstep processor 124L may be configured to output the primary memory write address XPTO_A with the primary copy of the write data XY_A, and the redundant memory write address XPTO_B with the redundant copy of the write data XY_B to a single memory controller 130, in sequential order. Alternatively, the lockstep processor 124L may be configured to output the primary memory write address XPTO_A with the primary copy of the write data XY_A to a primary memory controller 123A, and the redundant memory write address XPTO_B with the redundant copy of the write data XY_B to a redundant memory controller 130B.

The comparator 126 is configured to compare the primary and redundant copies of the write data XY_A, XY_B. The comparator 126 is also configured to compare the primary and redundant memory write addresses XPTO_A, XPTO_B. This comparison is to determine if there are any errors before the data is written in the memory 140. If the primary (XPTO_A) and redundant (XPTO_B) memory write addresses differ from what they should be, or the primary (XY_A) and redundant (XY_B) copies of the write data differ, the comparator 116 is configured to generate an error signal. This means that the MCU cannot be trusted and should shut down or enter a safe state within a certain period of time.

Optionally, the lockstep processor 124L may be configured to perform an inversion operation on the primary copy of the write data XY_A, and/or on the primary memory write address XPTO_A. Similarly, the lockstep processor 124L may be configured to perform an inversion operation on the redundant copy of the write data XY_B, and/or on the redundant memory write address XPTO_B. An inversion operation (0 to 1, and 1 to 0), which is suggested by ISO 26262 D2.4.4, enhances diagnostic coverage.

Further, the lockstep processor 124L may be configured to generate a primary Error Detection Correction (EDC) check bit to be transferred with the primary copy of the write data, and a redundant EDC check bit to be transferred with the redundant copy of the write data. While this disclosure describes EDC, the disclosure is not limited in this respect; the error detection and/or correction may be any type as suitable.

The non-lockstep processor 124NL is configured to, if the decoded write address corresponds with a non-lockstep region of the memory 140, write a single copy of the received write data XY to the decoded write address to the memory 140, as discussed further below with respect to FIG. 3. Again, the non-lockstep processor 124LR provides a lower integrity level, such as ASIL-B, but also provides a full performance.

Figure 2A:
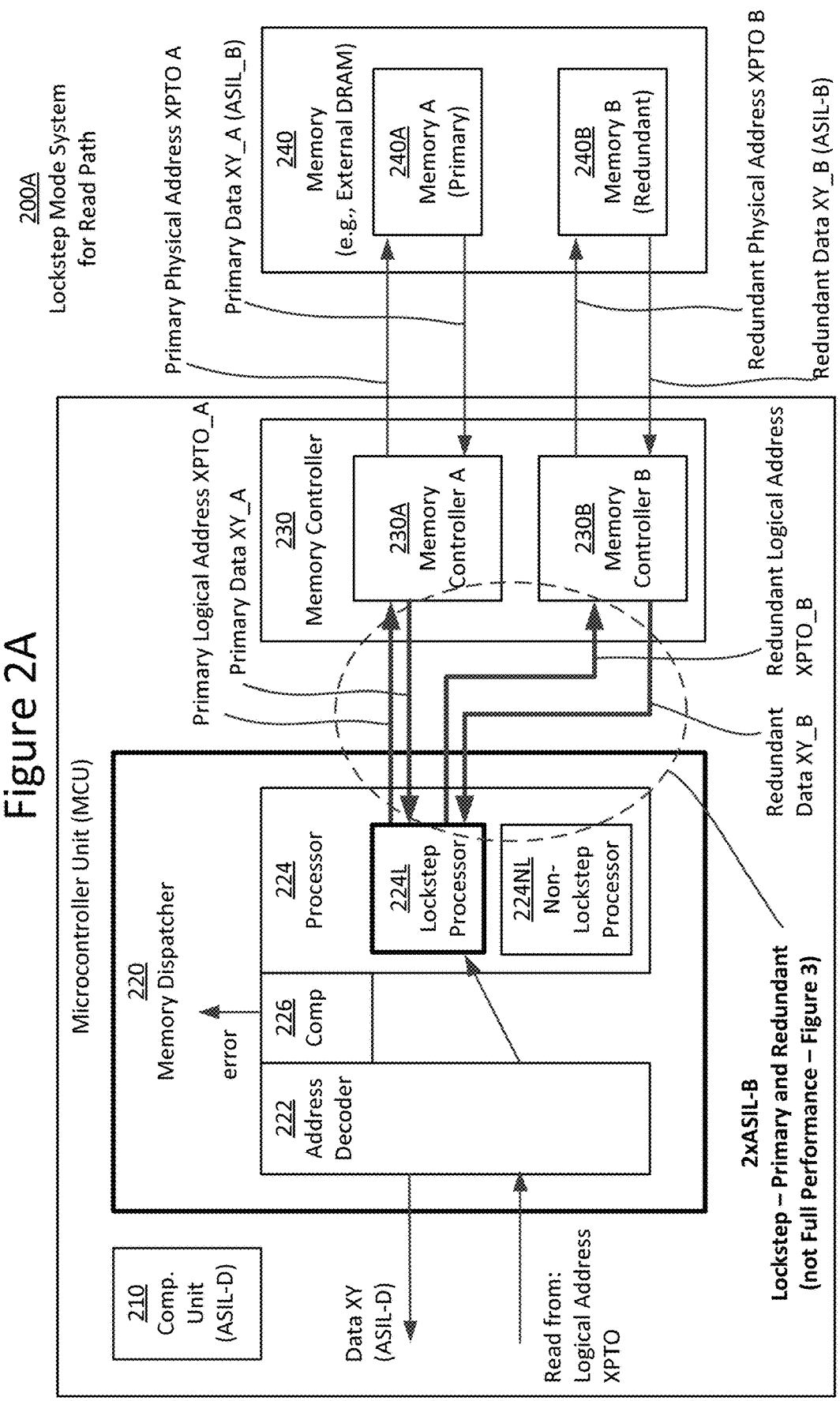
FIG. 2A illustrates a schematic diagram of a lockstep mode system for a read path in accordance with aspects of the disclosure.
Figure 2B:
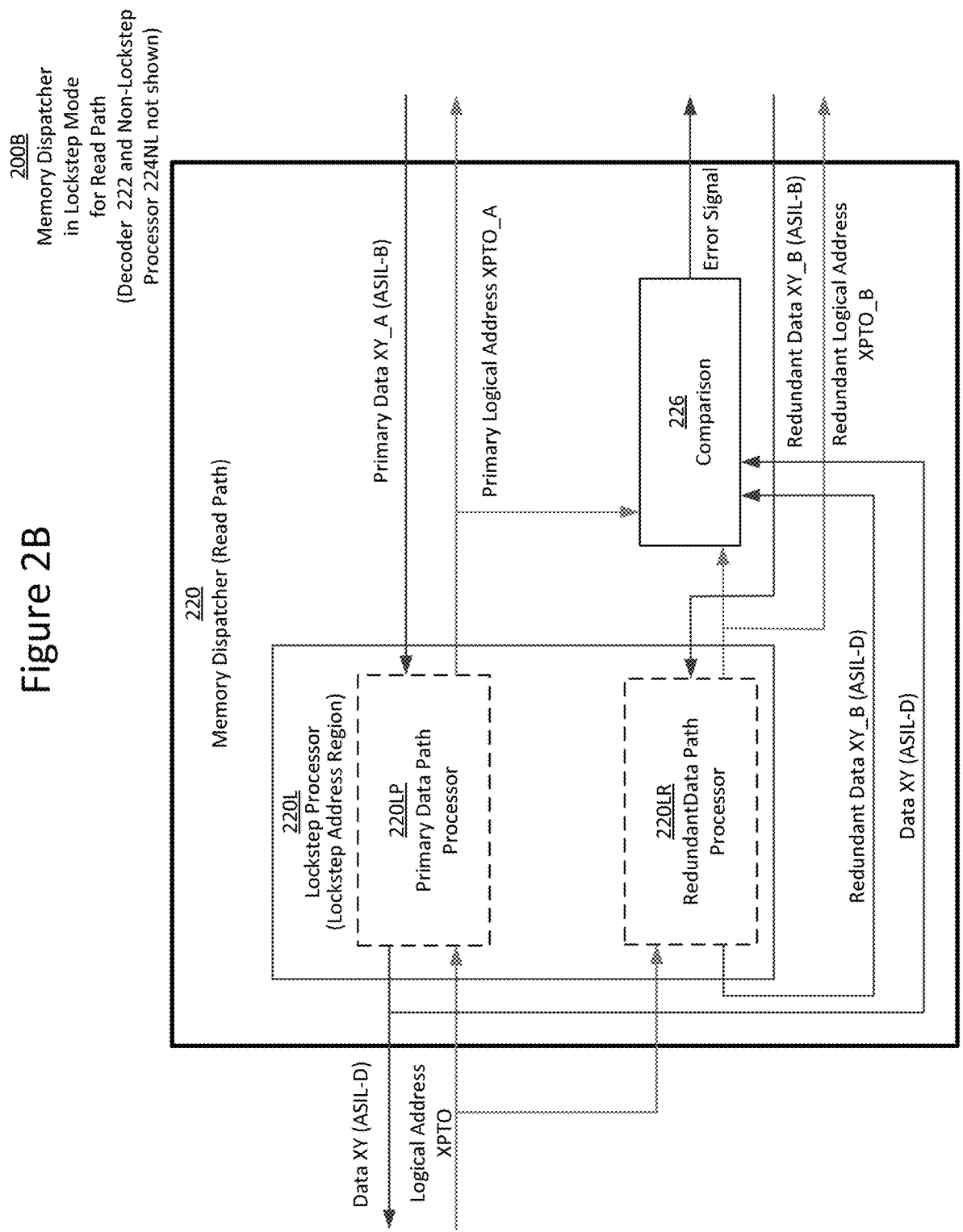
FIG. 2B illustrates a schematic diagram of a memory dispatcher of the lockstep mode system for a read path of FIG. 2A in accordance with aspects of the disclosure.

FIG. 2A illustrates a schematic diagram of a lockstep mode system 200A for a read path, as opposed to the write path of FIGS. 1A and 1B, in accordance with aspects of the disclosure. FIG. 2B illustrates a schematic diagram of a memory dispatcher 210 of the lockstep mode system 200A for a read path of FIG. 2A.

Components of FIGS. 2A and 2B having similar reference numerals as components of FIGS. 1A and 1B are substantially the same, and for the sake of brevity, their descriptions are not repeated here. More specifically, computation unit 210, memory dispatcher 220, memory controller 230, and external memory 240 correspond with the computation unit 110, memory dispatcher 120, memory controller 130, and external memory 140, respectively.

By way of overview, the lockstep mode system 200A has a memory dispatcher 220 for reading data from memory 240 in lockstep mode. The lockstep mode is for data requiring a high integrity level (e.g., ASIL-D). The memory dispatcher 220 duplicates the read address to read the original and duplicate data from two respective memories 240A, 240B without processing unit intervention.

The address decoder 222 receives a single logical read address XPTO. The address decoder is configured to decode a logical read address XPTO.

If the decoded read address XPTO corresponds with a lockstep region of the memory 240, the lockstep processor 224L is configured to generate, based on the decoded read address XPTO, primary and redundant memory read addresses XPTO_A, XPTO_B. The primary data path processor 220LP is configured to generate the primary memory read address XPTO_A. The redundant data path processor 220LR is configured to generate the redundant memory read address XPTO_B in lockstep with the primary data path processor 220LP.

Each of the memory controllers 230A, 230B is configured to generate, from the decoded logical read addresses XPTO_A, XPTO_B, a physical address of the memory 140 and initiate a memory read cycle. The primary copy of the read data XY_A is read from the primary memory 240A and transmitted to the memory dispatcher 220 via the memory controller 230A, and the redundant copy of the read data XY_B is read from the redundant memory 240B and transmitted to the memory dispatcher 220 via the memory controller 230B.

The comparator 226 is configured to compare the primary and redundant copies of the read data XY_A, XY_B. The comparator 226 is also configured to compare the primary and redundant memory read addresses XPTO_A, XPTO_B. If the primary (XPTO_A) and redundant (XPTO_B) memory read addresses differ from what they should be, or the primary (XY_A) and redundant (XY_B) copies of the read data differ, the comparator 116 is configured to generate an error signal. This means that the MCU cannot be trusted and should be shut down or enter a safe state within a certain period of time. The comparator 226 may be further configured to synchronize the received primary read data XY_A with the corresponding received redundant read data XY_B.

Optionally, the primary data path processor 224LP may be configured to perform an inversion operation on a primary copy of read data XY_A from the primary memory read address XPTO_A depending on how the primary copy of the read data XY_A was written, or on the primary memory read address XPTO_A depending on how the primary memory address XPTO_A was generated, as discussed above with respect to FIGS. 1A and 1B. Also, the redundant data path processor 224LP may be configured to perform an inversion operation on a redundant copy of the read data XY_B from the redundant memory read address XPTO_B depending on how the redundant copy of the read data XY_B was written, or on the redundant memory read address XPTO_B depending on how the redundant memory address XPTO_B was generated, as also discussed above with respect to FIGS. 1A and 1B. The inversion operation, which is suggested by ISO26262 D2.4.4, enhances diagnostic coverage.

The lockstep processor 224L may be configured to receive the primary memory read address XPTO_A with the primary copy of the read data XY_A from a primary memory controller 230A, and receive the redundant memory read address XPTO_B with the redundant copy of the read data XY_B from a redundant memory controller 230B. Alternatively, the lockstep processor 224L may be configured to receive the primary memory read address XPTO_A with the primary copy of the read data XY_A, and the redundant memory read address XPTO_B with the redundant copy of the read data XY_B from a single memory controller 230, in sequential order.

The read data XY corresponding to the read address has a high integrity level, such as ASIL-D. Each of the primary and redundant copies of the read data XY_A, XY_B have a lower integrity level, such as ASIL_B, but together in lockstep they have an integrity level ASIL-D.

The lockstep processor 224L may be further configured to detect any errors in the primary copy of the read data XY_A by comparing primary Error Detection Correction (EDC) check bits received with the primary copy of the read data XY_A with stored EDC check bits. If the primary received and stored EDC check bits differ, the lockstep processor 224L is configured to correct an error in the received primary copy of the read data XY_A. Similarly, if the lockstep processor 224L may be configured to detect any errors in the redundant copy of the read data XY_B by comparing redundant EDC check bits received with the redundant copy of the read data XY_B with the stored EDC check bits. If the redundant received and stored EDC check bits differ, the lockstep processor 224L may be configured to correct an error in the received redundant copy of the read data XY_B. The stored EDC check bit compared with the received primary and redundant copies of the read data XY_A, XY_B may be the same EDC check bit, or alternatively, different EDC check bits.

The lockstep processor 220L may be further configured to determine if the primary or redundant copies of the read data XY_A, XY_B are not received within a predetermined period of time. If the primary or redundant copies of the read data XY_A, XY_B are not received within a predetermined period of time, the lockstep processor 220L may generate an error signal.

The non-lockstep processor 224LR is configured to, if the decoded read address XPTO corresponds with a non-lockstep region of the memory 240, read a single copy of the read data from the decoded read address in the memory 240, as discussed further below with respect to FIG. 3. Again, the non-lockstep processor 224LR provides a lower integrity level, such as ASIL-B, but also provides a higher performance.

Figure 3:
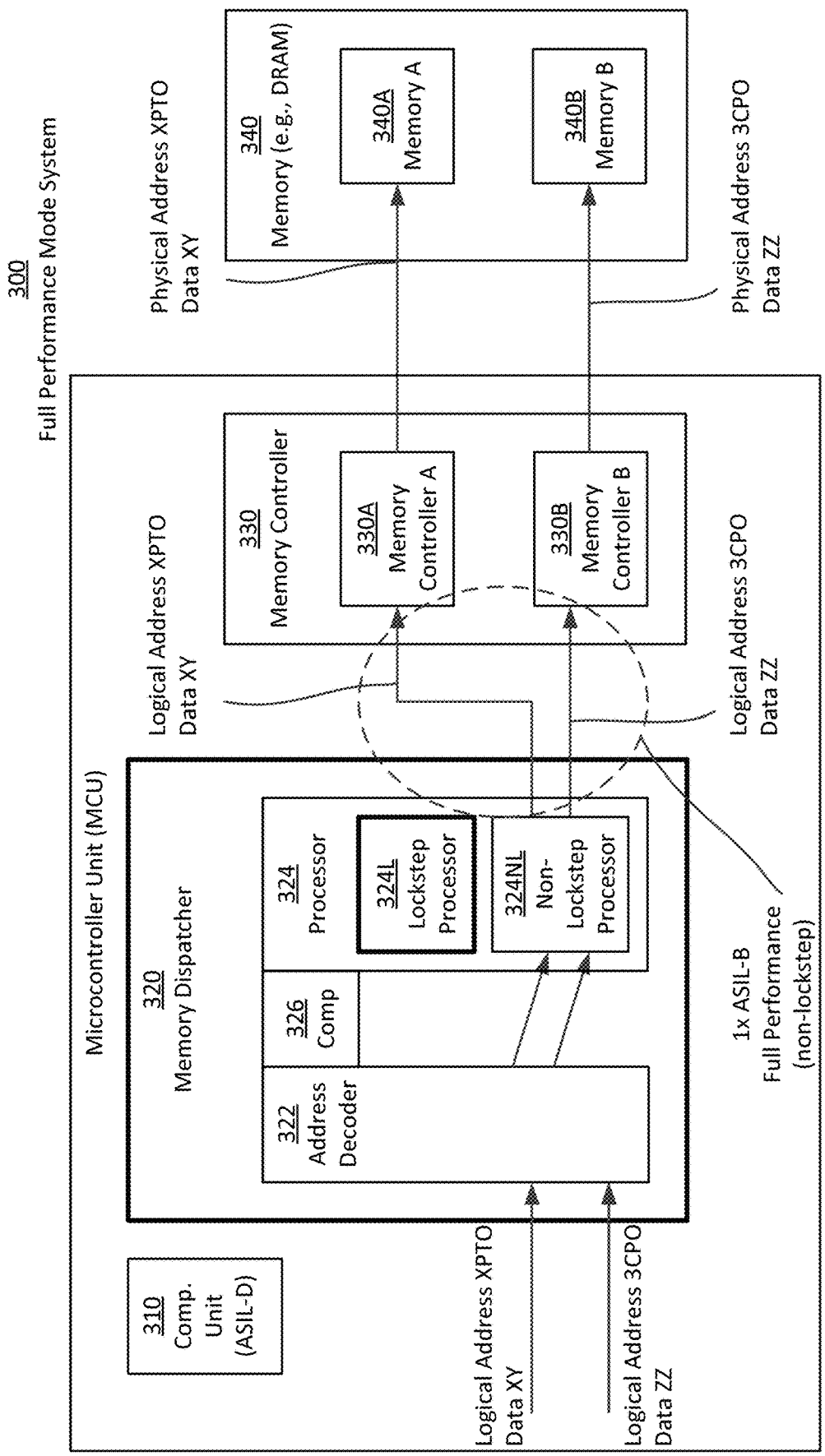
FIG. 3 illustrates a schematic diagram of a full performance mode system in accordance with aspects of the disclosure.

FIG. 3 illustrates a schematic diagram of a full performance mode system 300 in accordance with aspects of the disclosure.

Components of FIGS. 3A and 3B having similar reference numerals as components of FIGS. 1A and 1B are substantially the same, and for the sake of brevity, their descriptions are not repeated here. More specifically, computation unit 310, memory dispatcher 320, memory controller 330, and external memory 340 correspond with the computation unit 110, memory dispatcher 120, memory controller 130, and external memory 140, respectively.

Full performance mode occurs when a decoded logical address corresponds with a non-lockstep region of the memory 340 and thus does not require the higher integrity level ASIL-D; a lower integrity level, such as ASIL-B, is sufficient. During this mode, the memory dispatcher 320 does not generate a redundant address or redundant data. Instead, each data path is independent with different addresses and corresponding data, as in conventional systems. The first address XPTO for data XY maps to memory 340A only. Another address 3CPO for data ZZ maps to memory 340B only. This full performance mode, results in the MCU having the same efficiency as a conventional MCU.

More specifically, the address decoder 322 receives two logical addresses XPTO, 3CPO and two corresponding sets of data XY, ZZ. This data XY and ZZ have an integrity level ASIL-B, unlike the received data XY as discussed above with respect the FIGS. 1A, 1B, 2A, and 2B. The address decoder 322 is configured to decode the logical addresses XPTO, 3CPO.

If the decoded logical address corresponds with a non-lockstep region of the memory 440, the non-lockstep processor 324NL is configured to process the decoded logical address XPTO and corresponding data XY. Subsequently, the non-lockstep processor 324NL is configured to process the decoded logical address 3CPO and corresponding data ZZ.

The memory controller 330A is configured to generate, from logical address XPTO, a physical address XPTO of the memory 340 and initiate a memory write cycle to write data XY to memory 340A. Similarly, the memory controller 330B is configured to generate, from logical address 3CPO, a physical address 3CPO of the memory 340 and initiate a memory write cycle to write data ZZ to memory 340B. A similar process occurs to read the data XY, ZZ.

FIG. 4 illustrates a flowchart 400 of a method of memory dispatching in accordance with aspects of the disclosure.

Step 410 is decoding, by an address decoder 122/222, a write address of received write data or a read address.

Step 420 is generating, by a lockstep processor 124L/224L, and based on the decoded write/read address XPTO: primary and redundant memory write addresses XPTO_A, XPTO_B and corresponding primary and redundant copies of the write data XY_A, XY_B, if the decoded write address XPTO corresponds with a lockstep region of an memory (Sub-Step 422); or primary and redundant memory read addresses XPTO_A, XPTO_B, if the decoded read address XPTO corresponds with a lockstep region of the memory (Sub-Step 424).

Step 430 is comparing, by a comparator 126/226 coupled to the lockstep processor 124L/224L: the primary and redundant copies of the write data XY_A, XY_B, and the primary and redundant memory write addresses XPTO_A, XPTO_B (Sub-Step 432); or the primary and redundant copies of the read data XY_A, XY_B, and the primary and redundant memory read addresses XPTO_A, XPTO_B (Sub-Step 434).

The memory dispatcher of this disclosure provides high diagnostic coverage with data replication when external memory is used for storing data at an ASIL-D integrity level. The memory dispatcher also results in increased overall computation performance because an ASIL-D computation unit may be offloaded to the memory dispatcher. An automatic comparison saves time by providing the computation unit its requested data as soon as the primary data is available, and then the computation unit can be used for subsequent tasks until and unless the comparator outputs an error signal.

The techniques of this disclosure may also be described in the following examples.

Example 1

A memory dispatcher, comprising: an address decoder configured to decode a write address of received write data; a lockstep processor configured to generate, based on the decoded write address, primary and redundant memory write addresses and corresponding primary and redundant copies of the write data, if the decoded write address corresponds with a lockstep region of the memory; and a comparator coupled to the lockstep processor, and configured to compare the primary and redundant copies of the write data, and to compare the primary and redundant memory write addresses.

Example 2

The memory dispatcher of example 1, wherein the lockstep processor comprises: a primary data path processor configured to generate the primary memory write address and the primary copy of the write data; and a redundant data path processor configured to generate the redundant memory write address and the redundant copy of the write data in lockstep with the primary data path processor.

Example 3

The memory dispatcher of any combination of examples 1 and 2, wherein: the primary data path processor is configured to perform an inversion operation on the primary copy of the write data, or on the primary memory write address, or the redundant data path processor is configured to perform an inversion operation on the redundant copy of the write data, or on the redundant memory write address.

Example 4

The memory dispatcher of any combination of examples 1-3, wherein the lockstep processor is configured to output the primary memory write address with the primary copy of the write data, and the redundant memory write address with the redundant copy of the write data to a single memory controller, in sequential order.

Example 5

The memory dispatcher of any combination of examples 1-4, wherein the lockstep processor is configured to output the primary memory write address with the primary copy of the write data to a primary memory controller, and the redundant memory write address with the redundant copy of the write data to a redundant memory controller.

Example 6

The memory dispatcher of any combination of examples 1-5, wherein the primary memory write address and the redundant memory write address are located in separate memories.

Example 7

The memory dispatcher of any combination of examples 1-6, wherein the comparator is configured to generate, if the primary and redundant memory write addresses differ or the primary and redundant copies of the write data differ, an error signal.

Example 8

The memory dispatcher of any combination of examples 1-7, wherein the received write data has a first integrity level, the primary and redundant copies of the write data have a second integrity level, and the first integrity level is higher than the second integrity level.

Example 9

The memory dispatcher of any combination of examples 1-8, further comprising: a non-lockstep processor configured to, if the decoded write address corresponds with a non-lockstep region of the memory, write a single copy of the received write data to the decoded write address to the memory.

Example 10

The memory dispatcher of any combination of examples 1-9, wherein the lockstep processor is further configured to generate a primary Error Detection Correction (EDC) check bit to be transferred with the primary copy of the write data, and a redundant EDC check bit to be transferred with the redundant copy of the write data.

Example 11

A memory dispatcher, comprising: an address decoder configured to decode a read address; a lockstep processor configured to generate, based on the decoded read address, primary and redundant memory read addresses, if the decoded read address corresponds with a lockstep region of an memory; and a comparator coupled to the lockstep processor, and configured to compare the primary and redundant copies of the read data, and to compare the primary and redundant memory read addresses.

Example 12

The memory dispatcher of example 11, wherein the lockstep processor comprises: a primary data path processor configured to generate the primary memory read address; and a redundant data path processor configured to generate the redundant memory read address in lockstep with the primary data path processor.

Example 13

The memory dispatcher of any combination of examples 11 and 12, wherein: the primary data path processor is configured to perform an inversion operation on a primary copy of read data from the primary memory read address depending on how the primary copy of the read data was written, or on the primary memory read address depending on how the primary memory address was generated, or the redundant data path processor is configured to perform an inversion operation on a redundant copy of the read data from the redundant memory read address depending on how the redundant copy of the read data was written, or on the redundant memory read address depending on how the redundant memory address was generated.

Example 14

The memory dispatcher of any combination of examples 11-13, wherein the lockstep processor is configured to receive the primary memory read address with the primary copy of the read data, and the redundant memory read address with the redundant copy of the read data from a single memory controller, in sequential order.

Example 15

The memory dispatcher of any combination of examples 11-14, wherein the lockstep processor is configured to receive the primary memory read address with the primary copy of the read data from a primary memory controller, and the redundant memory read address with the redundant copy of the read data from a redundant memory controller.

Example 16

The memory dispatcher of any combination of examples 11-15, wherein the primary memory read address and the redundant memory read address are located in separate memories.

Example 17

The memory dispatcher of any combination of examples 11-16, wherein if the primary copy and the redundant copy of the read data differ, or the primary and redundant memory read addresses differ, the comparator is configured to generate an error signal.

Example 18

The memory dispatcher of any combination of examples 11-17, wherein read data corresponding to the read address has a first integrity level, the primary and redundant copies of the read data have a second integrity level, and the first integrity level is higher than the second integrity level.

Example 19

The memory dispatcher of any combination of examples 11-18, further comprising: a non-lockstep processor configured to, if the decoded read address corresponds with a non-lockstep region of the memory, read a single copy of the read data from the decoded read address in the memory.

Example 20

The memory dispatcher of any combination of examples 11-19, wherein the lockstep processor is further configured to: detect any errors in the primary copy of the read data by comparing primary Error Detection Correction (EDC) check bits received with the primary copy of the read data with stored EDC check bits, and if the primary received and stored EDC check bits differ, correct an error in the received primary copy of the read data, or detect any errors in the redundant copy of the read data by comparing redundant EDC check bits received with the redundant copy of the read data with the stored EDC check bits, and if the redundant received and stored EDC check bits differ, correct an error in the received redundant copy of the read data.

Example 21

A method of memory dispatching, comprising: decoding, by an address decoder, a write address of received write data or a read address; generating, by a lockstep processor, and based on the decoded write address or the decoded read address: primary and redundant memory write addresses and corresponding primary and redundant copies of the write data, if the decoded write address corresponds with a lockstep region of an memory; or primary and redundant memory read addresses, if the decoded read address corresponds with a lockstep region of the memory; and comparing, by a comparator coupled to the lockstep processor: the primary and redundant copies of the write data, and the primary and redundant memory write addresses; or the primary and redundant copies of the read data, and the primary and redundant memory read addresses.

Example 22

The method of example 21, further comprising: determining, by the lockstep processor, if the primary or redundant copies of the read data are not received within a predetermined period of time; and if the primary or redundant copies of the read data are not received within a predetermined period of time, generating an error signal.

Example 23

The method of any combination of examples 21 and 22, further comprising: synchronizing, by the comparator, the received primary read data with the corresponding received redundant read data.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. A memory dispatcher for a memory having a lockstep region and a non-lockstep region, comprising:
  an address decoder configured to decode a primary memory write address of received primary write data;
  a lockstep processor configured to generate, based on the decoded primary memory write address, a redundant memory write address, and a redundant copy of the write data, if the decoded write address corresponds with the lockstep region of the memory indicating lockstep mode and not if the decoded memory address corresponds with the non-lockstep region of the memory indicating full performance mode; and
  a comparator coupled to the lockstep processor, and configured to compare the primary and redundant copies of the write data, and to compare the primary and redundant memory write addresses.

2. The memory dispatcher of claim 1, wherein the lockstep processor comprises:
  a primary data path processor configured to generate the primary memory write address and the primary copy of the write data; and a redundant data path processor configured to generate the redundant memory write address and the redundant copy of the write data in lockstep with the primary data path processor.

3. The memory dispatcher of claim 2, wherein:
the primary data path processor is configured to perform an inversion operation on the primary copy of the write data, or on the primary memory write address, or
the redundant data path processor is configured to perform an inversion operation on the redundant copy of the write data, or on the redundant memory write address.

4. The memory dispatcher of claim 1, wherein the lockstep processor is configured to output the primary memory write address with the primary copy of the write data, and the redundant memory write address with the redundant copy of the write data to a single memory controller, in sequential order.

5. The memory dispatcher of claim 1, wherein the lockstep processor is configured to output the primary memory write address with the primary copy of the write data to a primary memory controller, and the redundant memory write address with the redundant copy of the write data to a redundant memory controller.

6. The memory dispatcher of claim 1, wherein the primary memory write address and the redundant memory write address are located in separate memories.

7. The memory dispatcher of claim 1, wherein the comparator is configured to generate, if the primary and redundant memory write addresses differ or the primary and redundant copies of the write data differ, an error signal.

8. The memory dispatcher of claim 1, wherein the received write data has a first integrity level, the primary and redundant copies of the write data have a second integrity level, and the first integrity level is higher than the second integrity level.

9. The memory dispatcher of claim 1, further comprising:
a non-lockstep processor configured to, if the decoded write address corresponds with the non-lockstep region of the memory but not if the decoded write address corresponds with the lockstep region of the memory, write a single copy of the received write data to the decoded write address to the memory.

10. The memory dispatcher of claim 1, wherein the lockstep processor is further configured to generate a primary Error Detection Correction (EDC) check bit to be transferred with the primary copy of the write data, and a redundant EDC check bit to be transferred with the redundant copy of the write data.

11. A memory dispatcher for a memory having a lockstep region and a non-lockstep region, comprising:
an address decoder configured to decode a primary memory read address;
a lockstep processor configured to generate, based on the decoded primary memory read address, a redundant memory read address, if the decoded read address corresponds with the lockstep region of the memory indicating lockstep mode and not if the decoded read address corresponds with the non-lockstep region of the memory indicating full performance mode; and
a comparator coupled to the lockstep processor, and configured to compare the primary and redundant copies of read data, and to compare the primary and redundant memory read addresses.

12. The memory dispatcher of claim 11, wherein the lockstep processor comprises:
a primary data path processor configured to generate the primary memory read address; and
a redundant data path processor configured to generate the redundant memory read address in lockstep with the primary data path processor.

13. The memory dispatcher of claim 12, wherein:
the primary data path processor is configured to perform an inversion operation on a primary copy of read data from the primary memory read address depending on how the primary copy of the read data was written, or on the primary memory read address depending on how the primary memory address was generated, or
the redundant data path processor is configured to perform an inversion operation on a redundant copy of the read data from the redundant memory read address depending on how the redundant copy of the read data was written, or on the redundant memory read address depending on how the redundant memory address was generated.

14. The memory dispatcher of claim 11, wherein the lockstep processor is configured to receive the primary memory read address with the primary copy of the read data, and the redundant memory read address with the redundant copy of the read data from a single memory controller, in sequential order.

15. The memory dispatcher of claim 11, wherein the lockstep processor is configured to receive the primary memory read address with the primary copy of the read data from a primary memory controller, and the redundant memory read address with the redundant copy of the read data from a redundant memory controller.

16. The memory dispatcher of claim 11, wherein the primary memory read address and the redundant memory read address are located in separate memories.

17. The memory dispatcher of claim 11, wherein if the primary copy and the redundant copy of the read data differ, or the primary and redundant memory read addresses differ, the comparator is configured to generate an error signal.

18. The memory dispatcher of claim 11, wherein read data corresponding to the read address has a first integrity level, the primary and redundant copies of the read data have a second integrity level, and the first integrity level is higher than the second integrity level.

19. The memory dispatcher of claim 11, further comprising:
a non-lockstep processor configured to, if the decoded read address corresponds with the non-lockstep region of the memory and not if the decoded read address corresponds with the lockstep region of the memory, read a single copy of the read data from the decoded read address in the memory.

20. The memory dispatcher of claim 11, wherein the lockstep processor is further configured to:
detect any errors in the primary copy of the read data by comparing primary Error Detection Correction (EDC) check bits received with the primary copy of the read data with stored EDC check bits, and if the primary received and stored EDC check bits differ, correct an error in the received primary copy of the read data, or
detect any errors in the redundant copy of the read data by comparing redundant EDC check bits received with the redundant copy of the read data with the stored EDC check bits, and if the redundant received and stored EDC check bits differ, correct an error in the received redundant copy of the read data.

21. A method of memory dispatching for a memory having a lockstep region and a non-lockstep region, comprising:
performing a write operation or a read operation, wherein the write operation comprises:
  decoding, by an address decoder, a primary memory write address of received primary write data;
  generating, by a lockstep processor, and based on the decoded primary memory write address, a redundant memory write address and a redundant copy of the write data, if the decoded write address corresponds with the lockstep region of the memory indicating lockstep mode and not if the decoded write address corresponds with the non-lockstep region of the memory indicating full performance mode; and
  comparing, by a comparator coupled to the lockstep processor the primary and redundant copies of the write data, and the primary and redundant memory write addresses; and
wherein the read operation comprises:
  decoding, by the address decoder, a primary memory read address;
  generating, by the lockstep processor, and based on the decoded primary memory read address, a redundant memory read address, if the decoded read address corresponds with the lockstep region of the memory and not if the decoded read address corresponds with the non-lockstep region of the memory; and
  comparing, by the comparator coupled to the lockstep processor, the primary and redundant copies of the read data, and the primary and redundant memory read addresses.

22. The method of claim 21, further comprising:
determining, by the lockstep processor, if the primary or redundant copies of the read data are not received within a predetermined period of time; and
if the primary or redundant copies of the read data are not received within a predetermined period of time, generating an error signal.

23. The method of claim 21, further comprising:
synchronizing, by the comparator, the received primary read data with the corresponding received redundant read data.

* * * * *